United States Patent [19]

Bridges

[11] Patent Number: 4,892,845
[45] Date of Patent: Jan. 9, 1990

[54] METHOD FOR FORMING CONTACTS THROUGH A THICK OXIDE LAYER ON A SEMICONDUCTIVE DEVICE

[75] Inventor: Jeffrey M. Bridges, Dallas, Tex.

[73] Assignee: Texas Instruments Incorporated, Dallas, Tex.

[21] Appl. No.: 646,559

[22] Filed: Aug. 31, 1984

[51] Int. Cl.⁴ .......................................... H01L 21/316
[52] U.S. Cl. .................................... 437/195; 437/187; 437/225; 437/238; 156/643; 156/646; 156/653; 156/657; 148/DIG. 133
[58] Field of Search ............................. 29/577 C, 591; 148/DIG. 133; 156/643, 646, 653, 657; 437/11, 195, 187, 203, 225, 238, 41

[56] References Cited

U.S. PATENT DOCUMENTS 4,172,004 10/1979 Alcorn et al. ................... 29/591 X
4,392,298 7/1983 Barker et al. ................... 29/591 X
4,470,874 9/1984 Bartush et al. ...................... 156/643

*Primary Examiner*—Brian E. Hearn
*Assistant Examiner*—T. N. Quach
*Attorney, Agent, or Firm*—Rodney M. Anderson; Melvin Sharp

[57] ABSTRACT

A method for fabricating contacts in a semiconductor substrate includes forming a thin buffer oxide layer (26) over a substrate (10) with active devices defined therein. Access openings (28), (30) and (32) are then formed in the thin oxide layer (26) and then aluminum columnar contacts (38), (40) and (42) formed therein with a predetermined height. A thick oxide layer of phosphorous silicate glass (50) is then formed over the built-up structure. A planarizing resist layer (52) is formed over top of the structure with a substantially thinner area defined proximate the upper surfaces of the columnar contacts (38, 40, 42). The thin areas (54, 56, 58) are removed by selectively etching away the upper surface of the resist layer (52) by an excited plasma process. The structure is then subjected to a phosphorous selective etch to remove only those portions of the thick oxide layer (52') proximate the upper surfaces of the columnar contacts (38, 40, 42). Interconnects are then formed on the surface for connection with the exposed surface of the columnar contacts.

9 Claims, 1 Drawing Sheet

METHOD FOR FORMING CONTACTS THROUGH A THICK OXIDE LAYER ON A SEMICONDUCTIVE DEVICE

TECHNICAL FIELD OF THE INVENTION

The present invention pertains in particular to fabrication of semiconductor devices and, more particularly, to the formation of contacts through the protective oxide layer.

BACKGROUND OF THE INVENTION

In the process of fabricating a semiconductor device, one important step is interfacing peripheral devices with the various active devices and interconnects defined in the semiconductor substrate. Normally, the active devices are first formed in a silicon substrate and then a protective oxide layer placed thereover. Access openings or via's are then patterned in the thick oxide layer followed by formation of metal contact pads. This conventional method is acceptable for geometries wherein the thickness of the oxide is considerably less than the width of the access openings. However, with decreasing geometries, the size of access openings is rapidly approaching the thickness of the protective oxide and present fabrication methods are found to be insufficient.

Present plasma technology approaches its limit for devices in which the protective oxide is greater than 5000 Å with contact spacings having geometries of less than four microns from edge to edge. When this conventional technology is utilized for geometries of this scale, definition around the edges of the contact holes is poorly defined, resulting in high resistance contacts or defective contacts that may present future reliability problems.

In view of the above disadvantages, there exists a need for a method of forming contacts that is acceptable with the type of geometries encountered with VLSI circuits.

SUMMARY OF THE INVENTION

The invention disclosed and claimed herein comprises a method for fabricating contacts on VLSI circuits. The method includes first defining active areas and interconnects in a substrate and then overlaying the structure with a thin oxide. Access openings or via's are then formed in the desired contact areas on the substrate and contacts formed therein. These contacts have a predetermined thickness that extends above the thin oxide layer. A layer of thick oxide is then formed on top of the thin oxide layer and around the formed contacts such that the top of the formed contact is exposed.

In forming the thick oxide layer, a layer of phosphorous silicate glass is utilized and is disposed over the entire substrate to conform to the shape thereof. A layer of planarizing resist is spun onto the built up substrate such that the thickness of the resist proximate the portion of the PSG layer adjacent the upper surface of the formed contact is thinner than the main portion of the resist layer. The resist is then removed from the upper surface downward until only the portion of the PSG layer covering the upper surfaces of the formed contacts is exposed. A phosphorous selective etch is then utilized to remove the exposed portion of the PSG layer until the upper surface of the formed contact is exposed. The resist layer is then removed and metal interconnects are formed on the surface of the PSG layer to interface with the exposed surface of the formed contacts.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
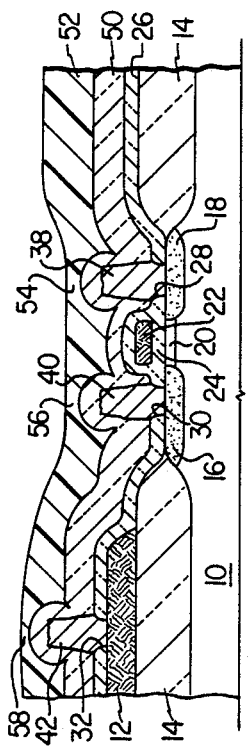
FIG. 1 illustrates a cross-sectional diagram of a silicon substrate with active devices formed therein and the buffer oxide layer deposited thereon.

Referring now to FIG. 1, there is illustrated a cross-sectional diagram of a substrate 10 with active areas and interconnects defined therein. The substrate 10 is a semiconductor material of a P-conductivity type or an N-conductivity type. For illustrative purposes, the structure for a field effect transistor (FET) is illustrated in addition to one interconnect run 12. The substrate 10 first has a field oxide 14 formed therein and then a source 16, a drain 18 and a channel 20 formed therein by conventional techniques. The process for forming these structures is described in U.S. Pat. Nos. 4,445,266 and 4,455,738, each of which is incorporated herein by reference. A gate 22 for the transistor is formed of a polysilicon run disposed over an oxide insulating layer 24. The interconnect 12 is also formed of polysilicon.

After the active structure and polysilicon interconnects have been formed in substrate 10, a buffer oxide layer 26 is deposited to a thickness of approximately 500 to 2000 Å. Up to this point, the process is the conventional prior art process. In the conventional process, precontact openings would then be formed through the buffer oxide and then a thick oxide layer deposited. Contact openings through the thick oxide layer would then be formed over the precontact openings to allow access to the desired contact areas.

In accordance with the present invention, an access opening 28 is formed in the buffer oxide 26 to allow access to the drain 18, an access opening 30 is formed in the buffer oxide layer 26 to allow access to the source 16 and an access opening 32 is formed in the buffer oxide layer 26 to allow access to the interconnect 12. The access openings 28-32 are formed by conventional methods but they are smaller than the precontact openings formed in the conventional process.

In defining the access openings 28-32, a positive resist is first applied to the surface of the buffer oxide and then the resist exposed to define a pattern therein by conventional techniques. The positive resist is then subjected to a clean-up operation which is referred to as "ASH". ASH is a technique which utilizes oxygen flow over the substrate in a vacuum and this oxygen is excited with an external radio frequency (RF) field. This essentially attacks any organic contamination that may exist in the surface. The positive resist is then baked on and subjected to a plasma etch to define the access openings 28, 30 and 32. The resist is then stripped off in an appropriate solvent.

Figure 2:
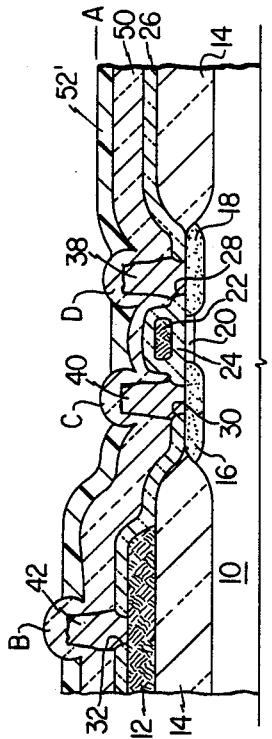
FIG. 2 illustrates a cross-sectional diagram of the substrate with a layer of aluminum deposited thereon and in contact with the desired contact areas.

Referring now to FIG. 2, there is illustrated a cross-sectional diagram of the next step in the formation of the contacts in accordance with the present invention, wherein like numerals refer to like parts in the various Figures. A layer of contact metal 34 is deposited onto the buffer oxide 26 to contact the source 16, drain 18 and interconnect 12 through the formed access openings. The conductive layer 34 is, in the preferred embodiment, aluminum which can be deposited in one of two ways. A layer of plasma polysilicon can first be deposited to a thickness of approximately 100 Å followed by deposition of 1.6 to 1.7 microns of aluminum. Alternatively, an aluminum with 2% silicon can be deposited directly without requiring the initial deposition of the plasma polysilicon. The conductive layer 34 is a conformal layer such that the thickness thereof is essentially constant over the entire surface of the substrate 10.

After deposition of the conductive layer 34, a layer of photo resist 36 is spun onto the surface of the conductive layer 34 in order to pattern the contacts. This is a similar process to patterning the access openings 28-32. After the pattern is formed, the conductive layer 34 is subjected to a plasma etch consisting of, for example, $CCL_4$, HCL and $N_2$. The conductive layer 34 is etched a sufficient amount of time to etch all the way through to the buffer oxide 26. However, the portions of the conductive layer 34 defined in the patterning process are not etched. This results in the formation of conductive columns, "columnar contacts" as illustrated in FIG. 3, wherein like parts refer to like numerals in the various Figures.

Figure 3:
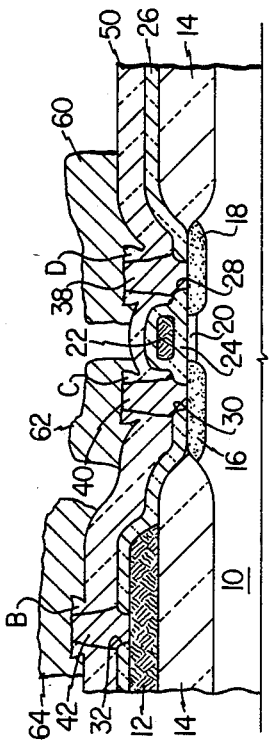
FIG. 3 illustrates a cross-sectional diagram of the substrate after etching of the reach up contacts.

In FIG. 3, an aluminum columnar contact 38 is defined which passes through the access opening 28 to contact the drain region 18 and an aluminum columnar contact 40 is formed that passes through the access opening 30 to contact the source region 16. An aluminum columnar contact 42 is formed through the access opening 32 to contact the interconnect 12. The columnar contacts 38, 40 and 42 have resist caps 44, 46 and 48 disposed on the upper surface thereof that are the remains of the photo resist layer 36 defined by the patterning technique. These resist caps are stripped in a solvent clean-up step.

Figure 4:
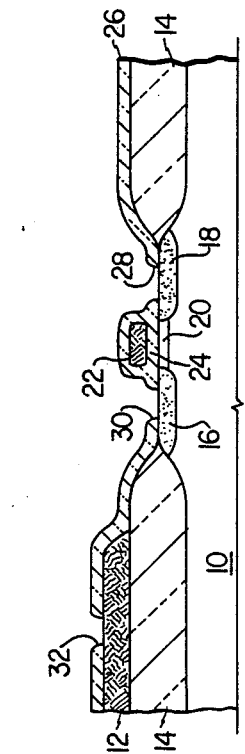
FIG. 4 illustrates a cross-sectional diagram of the substrate with both the thick oxide layer formed thereon and the planarizing resist deposited thereon and covering the entire surface of the substrate.

Referring now to FIG. 4, there is illustrated a cross-sectional diagram of the substrate 10 illustrating the next steps in the process, wherein like numerals refer to like parts in the various Figures. A layer of phosphorous silicon glass (PSG) 50 is deposited on top of the structure of FIG. 3 by atmospheric deposition. The substrate temperatures during this process are maintained under 400° C. to avoid "sintering". The PSG layer 50 has a thickness of approximately one micron. During deposition of the PSG layer 50, the thickness thereof on the vertical surfaces of the columns 38, 40 and 42 is slightly thinner than the thickness along the planar surfaces thereof. This is referred to as a "breadload" effect.

After deposition of the PSG layer 50, a layer of planarizing resist 52 is spun onto the surface of the PSG layer 50. The planarizing resist is a low viscosity resist which is placed into a "puddle" on the middle of the substrate and then the substrate spun at a high rpm to disperse the resist outward from the center of the puddle to form a thin layer. This thin layer is a "planarized" layer that does not conform to the surface contour of the PSG layer 50. Rather, the planarized layer 52 exhibits a tendency to collect at sharp corners and results in a relatively minimal thickness proximate to sharp peaks, such as those resulting from the PSG layer 50 proximate each of the columns 38, 40 and 42. For example, a thin area 54 in the planarized layer 52 exists proximate the upper surface of the column 38, a thin area 56 exists proximate the upper surface of the column 40 and a thin area 58 exists in the resist layer 52 proximate the upper surface of the column 42.

After spinning on the planarizing layer 52, the built-up substrate is subjected to an ASH as described above. In this process, the excited plasma attacks the upper surface of the planarizing resist layer 52 in a vertical direction. Essentially, the excited plasma creates an oxide on the surface of the planarizing resist layer 52 since it is an organic polymer, and this is removed therefrom. This causes the thickness of the resist layer 52 to decrease as a result of this etching action. This procedure is continued until the thin areas 54, 56 and 58 have been removed. This will leave behind a layer 52' of photo resist, as illustrated in FIG. 5, wherein like numerals refer to like parts in the various Figures.

In order to form a proper planarizing resist layer 52, it is necessary to thin down a standard photo resist with some form of solvent until the viscosity is such that the layer does not conform around sharp edges or peaks, such as those resulting from the build-up of the PSG layer 50 over each of the columnar contacts 38-42. In the preferred embodiment, the resist that is utilized is polymethylmethacrylate (PMMA) which can be thinned with acetone. The viscosity of the resist required to make a proper planarizing layer 52 is made by an empirical determination. If the viscosity of the photo resist is too low, thinning may result adjacent areas that are not sharp peaks, resulting in potential for the exposure of the PSG layer 50 therebelow. Alternatively, a viscosity that is too high will result in the areas 54, 56 and 58 being too thick wherein the PSG layer 50 will also be exposed at other undesirable areas.

Figure 5:
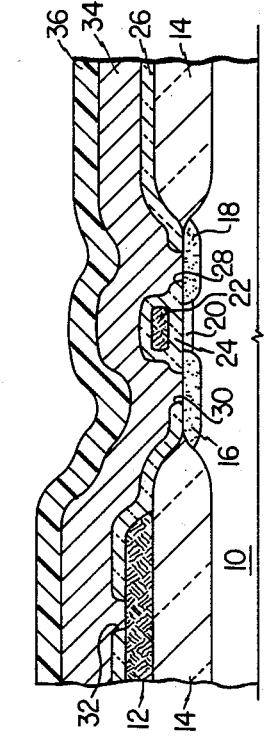
FIG. 5 illustrates a cross-sectional diagram of the substrate after removal of a portion of the planarizing resist and selective etching of the exposed thick oxide to expose the upper surface of the reach up contacts.
Figure 6:
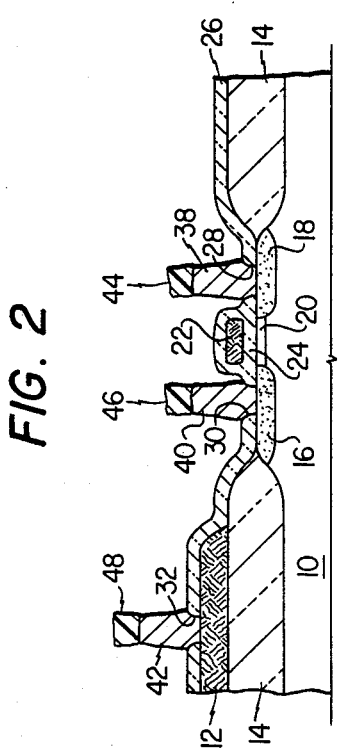
FIG. 6 illustrates a cross-sectional diagram of the substrate with interconnects formed on the surface of the thick oxide and interfacing with the reach up contacts.

Referring further to FIG. 5, the layer 52' has a thickness that just exposes the portions of the PSG layer 50 that are proximate the upper surface of the columnar contacts 38, 40 and 42. Once the select surfaces of the PSG layer 50 have been exposed, the built-up substrate is then rebaked to prevent potential pull up of the resist layer 52' and then the built-up substrate is subjected to a selective etch. This selective etch is a phosphorous selective etch which is comprised of hydrogen flouride (HF), nitric acid ($HNO_3$) and deionized water ($DIH_2O$). The proportions of the constituents of this etch are 2400 milliliters $DIH_2O$, 20 milliliters HF and 20 milliliters $HNO_3$. This etch is continued for approximately 25 minutes which is a sufficient amount of time to etch the 10,000 Å thickness of PSG covering the columnar contacts 38, 40 and 42 in addition to an approximately 30% over etch. Since this is a phosphorous selective etch, the aluminum columnar contacts 38, 40 and 42 are not affected, although some of the phosphorous will be removed from the vertical sides of the columnar contacts 38–42. After etching, the layer 52' is removed with a solvent clean up.

After removal of the layer 52', each of the columnar contacts 38, 40 and 42 has the upper surface thereof exposed with some of the PSG layer 50 remaining about the vertical sides thereof. The built-up substrate is then ready for an interconnect pattern which is done by a standard process. The standard process utilizes aluminum with 2% silicon that is sputtered on the built-up substrate to a thickness of approximately 1.2 micron and patterned to provide the interconnect pattern on the surface. This interconnect pattern results in an interconnect run 60 contacting the upper surface of the columnar contact 38, an interconnect run 62 interfacing with the upper surface of the columnar contact 40 and an interconnect run 64 interfacing with the upper surface of the columnar contact 42.

In summary, there has been disclosed a method for fabricating contacts through a thick oxide layer on a substrate. The method involves first forming contact holes or via's through the thin buffer oxide layer and then depositing thick contact pads through the access openings. A thick oxide is then deposited over the entire structure covering the built-up contacts. A planarizing photo resist is utilized to cover the entire surface and then, utilizing an excited plasma process, the thickness of the planarizing resist is reduced. Planarizing resist provides a selectively thin coating over the portions of the thick oxide layer proximate the top of the formed contacts. Reduction in the thickness of the planarizing resist layer exposes these portions of the thick oxide layer. A selective etch is then utilized to selectively etch only the exposed portions of the thick oxide without affecting the formed contacts. This effectively exposes the upper surfaces of the formed contacts to allow an interconnect pattern to be formed on the top of the substrate.

Although the preferred embodiment has been described in detail, it should be understood that various changes, substitutions and alterations can be made therein without departing from the spirit and scope of the invention as defined by the appended claims.

What is claimed is:

1. A method for forming contacts with semiconductor substrates, comprising:
    (a) providing a semiconductor substrate;
    (b) forming a thin oxide layer on the surface of the substrate;
    (c) patterning openings in said thin oxide layer to allow access to desired contact areas thereon;
    (d) forming conducting contacts in the formed openings extending upward from the substrate;
    (e) depositing a layer of thick oxide on the substrate to cover the thin oxide layer and formed contacts, the height above said substrate of the formed contacts being approximately equal to the thickness of the thick oxide layer; and then
    (f) selectively etching the resulting layer to remove only the portion of the thick oxide covering the upper surface of the formed contacts.

2. The method of claim 1 wherein the step of selectively removing the portions of the thick oxide layer comprises:
    depositing a layer of planarizing resist on the surface of the thick oxide layer such that the thickness of the planarizing resist proximate the portion of the thick oxide layer covering the formed contacts is relatively thinner than the remaining portions of the planarizing resist layer;
    uniformly decreasing the depth of the planarizing resist layer over the surface there to expose only the portion of the thick oxide layer covering the formed contacts; and
    selectively etching only the exposed portion of the thick oxide layer to remove only the exposed thick oxide layer portion without etching the formed contact.

3. The method of claim 2 wherein the thick oxide layer is phosphorous silicate glass and the selective etch is selective thereto.

4. A method for forming contacts with desired contact area on the surface of a substrate, comprising:
    forming a layer of thin oxide on the surface of the substrate;
    patterning openings in the thin oxide layer to allow access to the desired areas;
    forming conductive contacts in the formed openings extending upwards from the substrate a predetermined height;
    depositing a conformal layer of thick oxide over the substrate and formed contacts;
    selectively etching through the thick oxide layer over said contacts to expose only the upper surface of the formed contacts; and
    forming conductive interconnects on the surface of thick oxide and interfacing with the exposed surface of the formed contacts to provide conduction therewith.

5. The method of claim 4 wherein the step of forming the conductive contacts in the formed openings comprises:
    depositing a layer of metal over the thin oxide and formed openings having a thickness approximating the thickness of the thick oxide;
    forming patterned areas on the surface of the metal to provide the desired pattern for the formed contacts; and
    removing the portions of the metal layer outside of the patterned areas.

6. The method of claim 4 wherein the thick oxide is phosphorous silicate glass.

7. The method of claim 4 wherein the step of selectively etching comprises:
    depositing a layer of planarizing resist on the surface of the thick oxide, the thickness of the polarizing resist being relatively thinner over the upper protrusions of the thick oxide over the formed contacts; and
    substantially uniformly removing the planarizing resist to a depth approximately equal to the thickness of the planarizing resist over the upper surface of the formed contacts for exposure thereof.

8. A method for forming contacts to desired contact areas on the surface of a substrate, comprising:
    defining active regions and interconnects on the substrate;
    forming a buffer oxide on the surface of the substrate;
    patterning openings in the buffer oxide layer to allow access to desired areas on the defined active devices and interconnects;
    depositing a layer of aluminum on the surface of the buffer oxide;
    patterning contact areas on the formed aluminum layer;

etching the patterned aluminum layer down to the buffer oxide to provide formed contacts in the patterned openings of the buffer oxide;

depositing a conformal layer of thick oxide over the substrate and formed contacts;

depositing a layer of planarizing resist on the surface of the thick oxide such that the thickness of the planarizing resist proximate the portion of the thick oxide layer covering the upper surface of the formed contacts is relatively thinner than the remaining portions of the planarizing resist layer;

uniformly reducing the thickness of the planarizing resist to expose only the portion of the thick oxide adjacent the formed contacts;

selectively etching only the thick oxide to expose the upper surfaces of the formed contacts;

removing the remaining portion of the planarizing resistor, and forming conductive interconnects on the surface of the thick oxide in a predetermined pattern and interfaced with the exposed surfaces of the formed contacts to provide conduction therewith.

9. The method of claim 8 wherein the thick oxide is formed from phosphorous silicate glass.

* * * * *